(12) United States Patent
Chun (10) Patent No.: US 10,100,439 B2
(45) Date of Patent: Oct. 16, 2018

(54) HIGH THROUGHPUT CHEMICAL VAPOR DEPOSITION ELECTRODE

(71) Applicant: SUNPOWER CORPORATION, San Jose, CA (US)

(72) Inventor: Moon Chun, San Jose, CA (US)

(73) Assignee: SunPower Corporation, San Jose, CA (US)

( * ) Notice: Subject to any disclaimer, the term of this patent is extended or adjusted under 35 U.S.C. 154(b) by 73 days.

(21) Appl. No.: 15/144,469

(22) Filed: May 2, 2016

(65) Prior Publication Data

US 2016/0329456 A1 Nov. 10, 2016

Related U.S. Application Data

(60) Provisional application No. 62/159,159, filed on May 8, 2015.

(51) Int. Cl.
| | | |
|---|---|---|
| C30B 25/00 | (2006.01) | |
| C30B 35/00 | (2006.01) | |
| H01L 31/18 | (2006.01) | |
| C30B 29/06 | (2006.01) | |
| C23C 16/24 | (2006.01) | |
| C01B 33/035 | (2006.01) | |
| C30B 13/00 | (2006.01) | |
| C23C 16/01 | (2006.01) | |

(52) U.S. Cl.
CPC .......... C30B 35/007 (2013.01); C01B 33/035 (2013.01); C23C 16/01 (2013.01); C23C 16/24 (2013.01); C30B 13/00 (2013.01); C30B 29/06 (2013.01); H01L 31/1804 (2013.01)

(58) Field of Classification Search
CPC combination set(s) only.
See application file for complete search history.

(56) References Cited

U.S. PATENT DOCUMENTS

| | | |
|---|---|---|
| 3,820,935 A | 6/1974 | Dietze |
| 6,176,994 B1 | 1/2001 | Lacourcelle |
| 2007/0251455 A1 | 11/2007 | Wan et al. |
| 2008/0053823 A1 | 3/2008 | Mojana et al. |
| 2008/0206970 A1 | 8/2008 | Hugo et al. |
| 2009/0047204 A1* | 2/2009 | Kim ............... C01B 33/027 423/349 |
| 2011/0171395 A1 | 7/2011 | Juliano et al. |

FOREIGN PATENT DOCUMENTS

| | | |
|---|---|---|
| JP | 08-290901 A1 | 11/1996 |
| WO | WO 2015-013185 A1 | 1/2014 |

OTHER PUBLICATIONS

PCT International Search Report and Written Opinion for PCT International Appln No. PCT/US2016/030856 dated Jun. 29, 2016. (12 pages).

* cited by examiner

*Primary Examiner* — Erin F Bergner
(74) *Attorney, Agent, or Firm* — Schwabe, Williamson & Wyatt, P.C.

(57) ABSTRACT

Processes and systems to fabricate high throughput, low cost tubular polysilicon feed rods, which can be used as direct feedstock to grow a crystalline silicon material, are disclosed. In an example, a chemical vapor deposition (CVD) process includes depositing polysilicon on a tubular electrode to form a tubular polysilicon feed rod. The tubular polysilicon feed rod may be melted in a float zone process to grow the single-crystalline silicon material.

11 Claims, 8 Drawing Sheets

SECTION B – B

SECTION B – B
FIG. 4

HIGH THROUGHPUT CHEMICAL VAPOR DEPOSITION ELECTRODE

This application claims the benefit of U.S. Provisional Patent Application No. 62/159,159, filed May 8, 2015, which is hereby incorporated by reference in its entirety.

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of, and entering into, the substrate creates electron and hole pairs in the bulk of the substrate. The electron and hole pairs migrate to p-doped and n-doped regions in the substrate, thereby generating a voltage differential between the doped regions. The doped regions are connected to conductive regions on the solar cell to direct an electrical current from the cell to an external circuit coupled thereto.

Efficiency is an important characteristic of a solar cell as it is directly related to the capability of the solar cell to generate power. Likewise, efficiency in producing solar cells is directly related to the cost effectiveness of such solar cells. Accordingly, techniques for increasing the efficiency of solar cells, or techniques for increasing the efficiency in the manufacture of solar cells, are generally desirable.

The efficiency of solar cells may be improved by using high-quality crystalline silicon substrates to fabricate the solar cells. For example, solar cells fabricated using single-crystalline silicon wafers are generally more efficient than solar cells fabricated using multi-crystalline silicon wafers. The Czochralski technique has been widely adopted by the photovoltaic industry to make single-crystalline substrate, mainly because it is currently more cost effective than the less widely adopted float zone technique. However, the float zone technique can result in single-crystalline substrates of higher quality than those produced by the Czochralski technique, and thus, could become a preferred process for growing single-crystalline silicon materials if the cost efficacy of the process is improved.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology

The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs the task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. § 112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" barrier film layer does not necessarily imply that this barrier film layer is the first barrier film layer in a sequence; instead the term "first" is used to differentiate this barrier film layer from another barrier film layer (e.g., a "second" barrier film layer).

"Coupled"—The following description may refer to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outer", and "inner" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Processes and systems for cost-effectively fabricating single-crystalline silicon material are described herein. In the following description, numerous specific details are set forth, such as specific material regimes and process flow operations, in order to provide a thorough understanding of embodiments of the present disclosure. It will be apparent to one skilled in the art that embodiments of the present disclosure may be practiced without these specific details. In other instances, well-known fabrication techniques or parameters, such as parameters of a conventional "Siemens" CVD processing technique, are not described in detail in order to not unnecessarily obscure embodiments of the present disclosure. Furthermore, it is to be understood that the various embodiments shown in the figures are illustrative representations and are not necessarily drawn to scale.

A float zone technique entails passing an ingot of polysilicon through a radio frequency (RF) coil to generate a molten region that isolates impurities, resulting in the growth of a single-crystalline silicon material. Although the single-crystalline silicon material is very pure, the polysilicon ingots that are required as process precursors, i.e., feedstock, must have diameters of such a size that production of the ingots by a conventional chemical vapor deposition (CVD) process, also known as a "Siemens" CVD process, is extremely time-consuming (and thus, expensive). For example, using the "Siemens" CVD process, it can take tens of hours, e.g., 150 hours, to grow ingots having diameters that are suitable for use in the float zone process. This lengthy timeframe is due in part to the need to heat (and cool) high quality silicon seed pins to high temperatures, e.g., 1200 degrees Celsius, to switch the seed pins to a thermally conductive state in which thermal CVD reaction may occur for polysilicon deposition. Also, the deposition process must be slowed significantly to achieve the desired structural silicon quality that will make the deposited polysilicon suitable to be used as feedstock for the float zone technique. This process slowing also contributes to the lengthy timeframe for polysilicon rod production using a conventional "Siemens" CVD process. Accordingly, in order for the cost of single-crystalline silicon material fabricated by float zone processing to be reduced to a point that would be widely acceptable to solar cell manufacturers, a more cost-effective CVD process for fabricating polysilicon feedstock with the requisite size and structural quality is needed.

Some embodiments of the present disclosure allow for increased solar cell manufacturing efficiency by providing processes and systems to fabricate high throughput, low cost tubular polysilicon rods that can be used as direct feedstock in a float zone process. In an embodiment, a method of fabricating single-crystalline silicon material includes depositing polysilicon on an electrode having a core tube surrounded by a barrier film layer. Depositing the polysilicon forms a polysilicon tube around the electrode. The method may also include removing the electrode from the polysilicon tube. Removing the electrode may include flowing a cooling agent through a lumen of the core tube to cause the electrode to shrink to a smaller size than the polysilicon tube. Thus, the polysilicon tube may be separated from the electrode to provide a tubular polysilicon feed rod. The method may also include melting the polysilicon tube, e.g., in a float zone process, to grow a single-crystalline silicon material. The single-crystalline silicon material may subsequently be processed in various applications, e.g., by slicing the single-crystalline ingot to produce circular or polygonal solar cells.

In an aspect, a CVD process and system includes a deposition electrode having a core tube. The tubular structure of the electrode and a conductivity of the core tube may allow for lower temperatures to be used during the CVD process and for higher polysilicon deposition rates to be achieved. Thus, the CVD process may have an increased throughput of tubular polysilicon feed rods suitable as feedstock for a float zone process, and a resultant cost advantage over producing solid core feedstock by a conventional "Siemens" CVD process.

In an aspect, the electrode of the CVD process and system may be covered by a series of barrier film layers that prevent diffusion of the core tube material into the deposited polysilicon. Thus, the electrode may maintain a high polysilicon quality in the tubular polysilicon feed rod that results from the CVD process. Accordingly, the tubular polysilicon feed rod may be suitable for use in a float zone process to grow a very pure single-crystalline silicon material for use in fabricating photovoltaic cells.

In an aspect, the core tube and the barrier film layers include comparable coefficients of thermal expansion. Accordingly, after depositing polysilicon on the electrode during the CVD process, a cooling agent may be passed through a lumen of the electrode to cause the electrode to rapidly shrink and separate from the polysilicon tube. Thus, the electrode may be easily removed from the polysilicon tube, which may subsequently be used as the tubular polysilicon feed rod in the float zone process.

Figure 1:
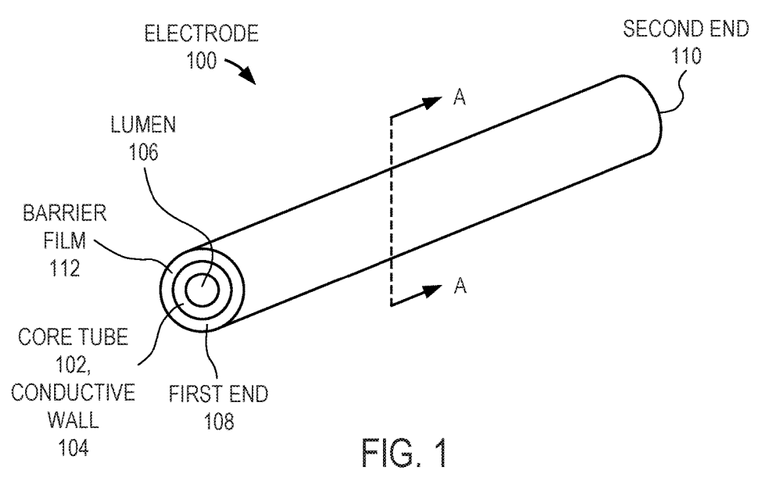
FIG. 1 is a perspective view of a deposition electrode in accordance with an embodiment.

Referring to FIG. 1, a perspective view of a deposition electrode is shown in accordance with an embodiment. In an embodiment, a CVD system for performing a CVD process includes an electrode 100 for CVD deposition of polysilicon. The electrode 100 may be a hollow electrode, i.e., a tubular electrode. For example, the electrode 100 may include a core tube 102 having a conductive wall 104 around a lumen 106. The lumen 106 may extend between a first end 108 and a second end 110 of the core tube 102 to carry a liquid cooling agent through the electrode 100 during the CVD process. The electrode 100 may further include a barrier film 112 around the conductive wall 104 of the core tube 102. That is, the barrier film 112 may cover the core tube 102 between the first end 108 and the second end 110 of the electrode 100. The core tube 102 may be a core portion of the electrode 100, which provides mechanical rigidity and stability to the electrode 100.

Figure 2:
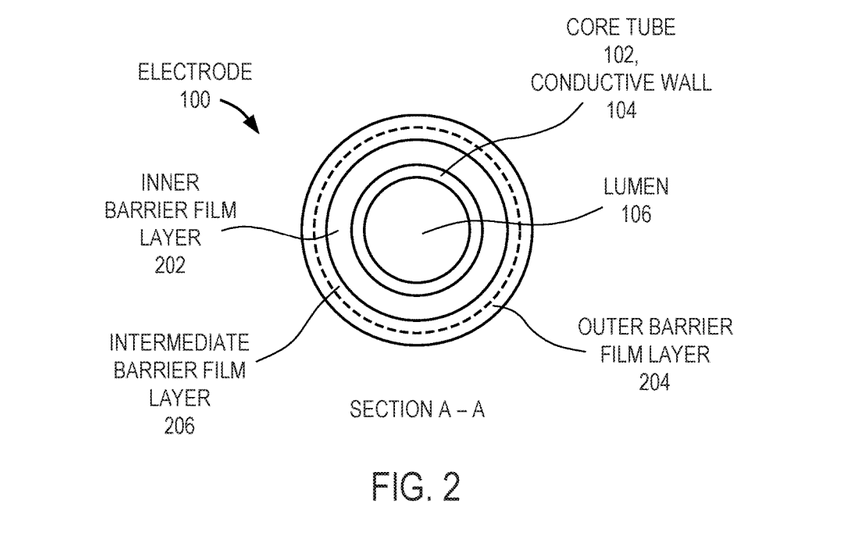
FIG. 2 is a cross-sectional view, taken about line A-A of FIG. 1, of a deposition electrode in accordance with an embodiment.

Referring to FIG. 2, a cross-sectional view, taken about line A-A of FIG. 1, of a deposition electrode is shown in accordance with an embodiment. In an embodiment, the conductive wall 104 of the core tube 102 may include an inner surface surrounding the lumen 106, and an outer surface separated from the inner surface by a wall thickness. The conductive wall 104 may have an annular cross-section, and thus, the inner surface may include an inner diameter and the outer surface may include an outer diameter. As described below, the inner surface and/or the outer surface of the cross-section may include alternative shapes, e.g., polygonal, curvilinear, etc., and thus, the outer and inner surfaces may be considered to have an outer dimension, rather than an outer diameter.

The core tube 102 may be formed from a conductive material, e.g., a thermally conductive and/or an electrically conductive material. In an embodiment, the conductive wall 104 of the core tube 102 is formed from a metal, such as a steel alloy material. Alternatively, the core tube 102 may be formed from a semimetal, such as graphite. The conductivity of conductive wall 104 may allow for lower temperature requirements of the CVD process, as compared to the temperatures required to switch silicon seed pins from a semiconducting state to a conducting state in a conventional "Siemens" CVD process. This can have two advantageous effects. First, a power supply design of the CVD system may be simplified by eliminating the need for multiple arrays of power supplies for different heating stages in the CVD process. That is, a single power supply may be used in a CVD system having the electrode 100. Second, lower processing temperatures require less time for heating and cooling, which can lead to shorter processing timeframes and increased throughput.

Still referring to FIG. 2, the core tube 102 may be coated by one or more, e.g., a series of, barrier film layers that prevent the core tube material from migrating into a surrounding polysilicon deposition material during a CVD process. In an embodiment, the barrier film 112 around the conductive wall 104 includes a metal diffusion barrier material. For example, the outer surface of the conductive wall 104 of the core tube 102 may be surrounded and covered by a first barrier film layer, e.g., an inner barrier film layer 202. Optionally, the inner barrier film layer 202 may be surrounded and covered by a second barrier film layer, e.g., an outer barrier film layer 204, having a respective metal diffusion barrier material. The barrier film layers may be formed from the same or different materials. For example, the inner barrier film layer 202 may be formed from a first metal diffusion barrier material and the outer barrier film layer 204 may be formed from a second metal diffusion barrier material. The first metal diffusion barrier material and the second metal diffusion barrier material may be different, e.g., the first metal diffusion barrier material may be a compound of silicon and nitrogen, e.g., silicon nitride, and the second metal diffusion barrier material may include titanium or titanium nitride, by way of example. One or more of the barrier film layers may be formed from an oxide of silicon, such as silicon dioxide. One or more of the barrier film layers may be formed from other materials to reduce an ohmic contact change between a metal of the core tube 102 and a silicon material to be deposited on the electrode 100. Each barrier film layer may have a same or different thickness relative to another barrier film layer. In an embodiment, the thickness of each layer may be in a range of 1 micron to 1 mm, for example, each layer may be in a range of 10-100 microns.

A two-layered barrier film 112 is illustrated by way of example only, and it will be appreciated that the barrier film 112 may include only one barrier film layer or more than two barrier film layers. For example, the barrier film 112 may include an intermediate barrier film layer 206 (represented by a dotted line in FIG. 2) disposed between the inner barrier film layer 202 and the outer barrier film layer 204. The intermediate barrier film layer 206 may include a respective metal diffusion barrier material having properties as described above.

In an embodiment, the barrier film layers have comparable coefficients of thermal expansion. For example, the coefficient of thermal expansion of all of the barrier film layers may be within 20% of each other. That is, the first metal diffusion barrier material may include a first coefficient of thermal expansion, and the second metal diffusion barrier material may include a second coefficient of thermal expansion, and the first coefficient of thermal expansion may be different than the second coefficient of thermal expansion by less than 20%. Alternatively, as in the case of having more than two barrier film layers, e.g., the intermediate barrier film layer 206 between the inner barrier film layer 202 and the outer barrier film layer 204, adjacent barrier film layers may have coefficients of thermal expansion within 20% of each other, and an outermost barrier film layer may have a coefficient of thermal expansion that is different from a coefficient of thermal expansion of an innermost barrier film layer by more than 20%. That is, the first metal diffusion barrier material of the inner barrier film layer 202 may include a first coefficient of thermal expansion, the second metal diffusion barrier material of the outer barrier film layer 204 may include a second coefficient of thermal expansion, and the first coefficient of thermal expansion may be different than the second coefficient of thermal expansion by more than 20%.

In an embodiment, the coefficient of thermal expansion of the one or more barrier film layers is comparable to the coefficient of thermal expansion of the core tube 102. For example, the coefficient of thermal expansion of at least one of the layers, e.g., the inner barrier film layer 202, may be within 20% of the coefficient of thermal expansion of the core tube 102.

In an embodiment, the electrode 100 results in a faster polysilicon deposition rate as compared to deposition rates inherent in conventional "Siemens" CVD processes. A rate of deposition of polysilicon depends on a diameter of a seed structure, e.g., a seed pin used in a conventional "Siemens" CVD process or the electrode 100 of the CVD system used in a CVD process as described below. More particularly, deposition rate increases with the outer dimension of the seed structure. Accordingly, given that the electrode 100 may have a diameter larger than a seed pin, the overall deposition rate may increase significantly due to its larger initial diameter compared to seed pins formed of pure silicon. Furthermore, the electrode 100 may be shaped to increase the surface area of the seed structure to further increase the polysilicon deposition rate and the process throughput.

Figure 3:
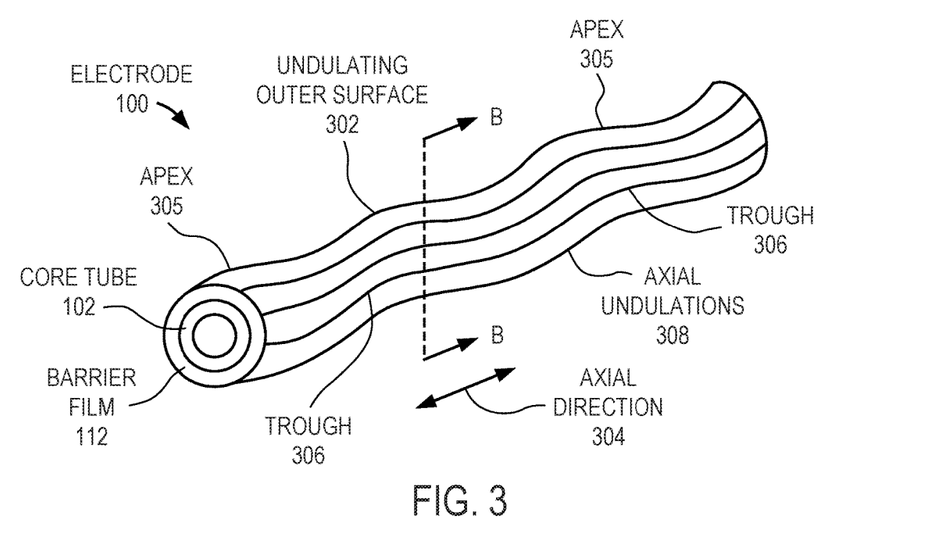
FIG. 3 is a perspective view of a deposition electrode in accordance with an embodiment.

Referring to FIG. 3, a perspective view of a deposition electrode is shown in accordance with an embodiment. The electrode 100 may have a shape that includes an outer surface to further increase a surface area of deposition, e.g., an outer surface of the barrier film 112, that is an undulating outer surface 302. More particularly, the undulating outer surface 302 may vary in an axial direction 304. For example, the undulating outer surface 302 may include one or more axial undulations 308 such as surface waves that propagate axially between one or more apices 305 and one or more troughs 306 in the axial direction 304. That is, a spline passing through an apex 305 in the axial direction 304 along the undulating outer surface 302 of the barrier film 112 may include a radial separation from a central axis of the lumen 106 that varies between the first end 108 and the second end 110 of the core tube 102. More particularly, the radial separation may increase and decrease in the axial direction 304 such that the spline may be understood as having an axial undulation 308. The undulating surface may increase the overall surface area of the electrode 100 as compared to a cylindrical outer surface with a constant radius in the axial direction 304. Accordingly, axial variations may be incorporated in the electrode 100 shape to increase electrode 100 surface area, and thus, increase polysilicon deposition rate in the CVD process described below.

Figure 4:
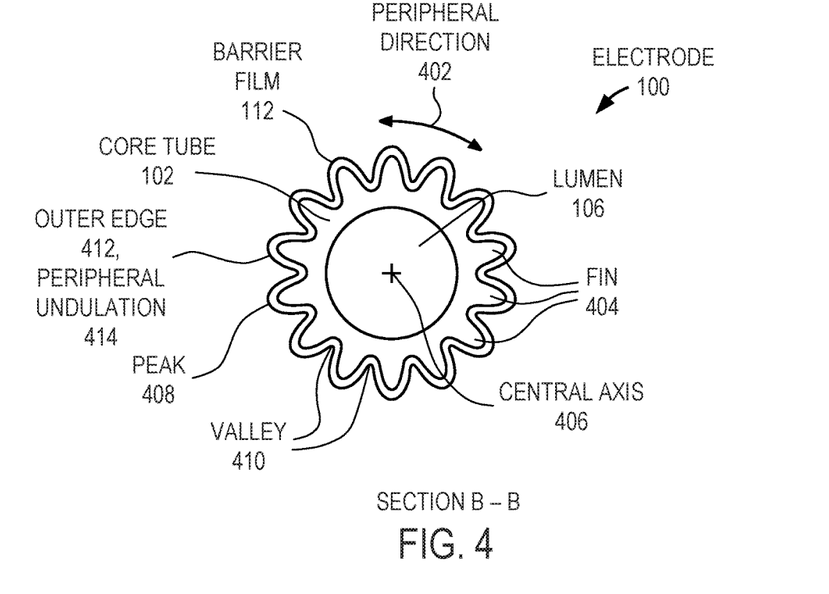
FIG. 4 is a cross-sectional view, taken about line B-B of FIG. 3, of a deposition electrode in accordance with an embodiment.

Referring to FIG. 4, a cross-sectional view, taken about line B-B of FIG. 3, of a deposition electrode is shown in accordance with an embodiment. The electrode 100 may have a shape that includes the undulating outer surface 302 having radial variation in a peripheral direction 402. For example, the core tube 102 may include radial undulations such as one or more fins 404 extending radially outward from a central axis 406 of the lumen 106. More particularly, each fin 404 may include a peak 408 between several valleys 410. That is, the peak 408 may include a respective radial separation from the central axis 406, and the valleys 410 may include respective radial separations from the central axis 406, and the radial separations of the valleys 410 may be less than the radial separation of the peak 408. Thus, the undulating outer surface 302 may extend over the fin 404 in the peripheral direction 402 around the central axis 406 such that the electrode 100 includes a cross-sectional profile having an outer edge 412. Since the outer edge 412 may include a variable separation from the central axis 406 in the peripheral direction 402, the outer edge 412 may include one or more peripheral undulations 414.

The outer edge 412 of the electrode 100 at any given axial location may be curvilinear. For example, when the undulating surface transitions smoothly through the peaks 408 and the valleys 410 of the peripheral undulations 414, e.g., along radii of curvature, the outer edge 412 may be considered to be a curvilinear cross-sectional outer edge 412. Alternatively, when the undulating surface transitions abruptly through the peaks 408 and the valleys 410 of the peripheral undulations 414, e.g., when the outer surface extends along straight lines interconnected at angles to zig-zag between peaks 408, the outer edge 412 may be considered to be a rectilinear cross-sectional outer edge 412. In both cases, the outer edge 412 may be non-circular, and thus, the undulating outer surface 302 may be non-cylindrical.

The peripheral undulations 414 may increase the overall surface area of the electrode 100 as compared to a cylindrical outer surface with a constant radius in the circumferential direction of a cross-section. By way of example, in a case of a cylindrical electrode, surface area between two points on the electrode may be proportional to the arc length between the points. In the case of the electrode 100 having fins 404, however, when a fin 404 is defined between two valleys 410 located at the two points separated by the arc length, a distance over a surface of the fin 404 may be, for example, twice the arc length, and thus, the surface area of the electrode 100 may be approximately twice that of the comparative cylindrical electrode 100.

Figure 5:
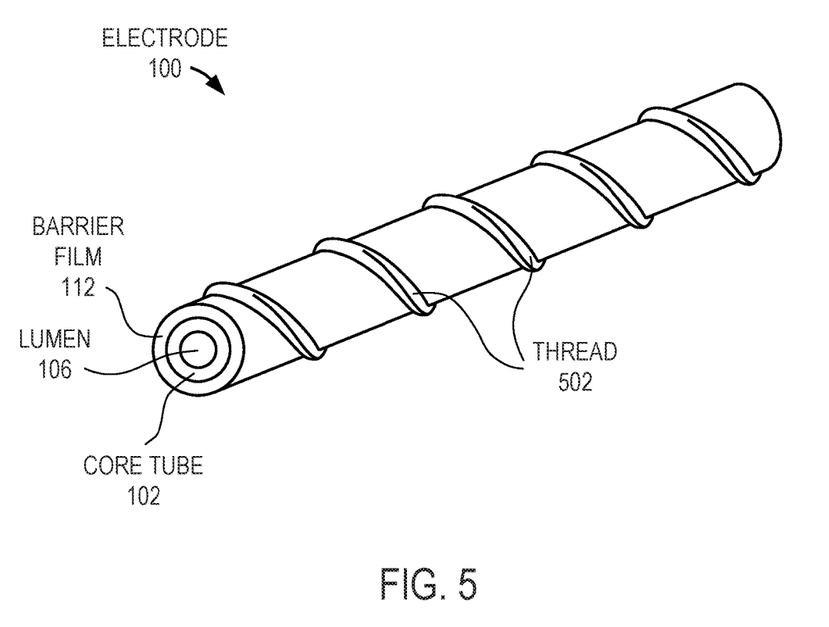
FIG. 5 is a perspective view of a deposition electrode in accordance with an embodiment.

Referring to FIG. 5, a perspective view of a deposition electrode is shown in accordance with an embodiment. As described above, the electrode 100 may have a shape that includes an undulating outer surface 302 having one or more of axial and/or radial variations. For example, the undulating outer surface 302 may have both axial and radial variations. In an embodiment, the undulating outer surface 302 include a helical structure, e.g., a thread 502, that propagates around the electrode 100 and includes both an axial and a peripheral component, e.g., a spiral shape. More particularly, the undulating outer surface 302 may include the fin 404 that extends helically around the central axis 406 of the lumen 106 between the first end 108 and the second end 110 of the core tube 102 such that the electrode 100 includes the thread 502. As described above, the axial and radial variation of the thread 502 may increase the overall surface area of the electrode 100 as compared to a cylindrical outer surface.

As described above, the electrode 100 may include the lumen 106 through at least a portion of the electrode 100 length. The lumen 106 is illustrated as being cylindrical, i.e., being defined by the inner surface of the core tube 102 that includes a circular cross-section. The inner surface may, however, include axial or radial variations similar to those variations described above with respect to the outer surface of the electrode 100. Furthermore, the inner surface may have an inner diameter that is sized to allow for the introduction of a cooling agent, such as liquid nitrogen, during the CVD process described below. For example, the inner diameter may be in a range of 5-50 mm.

Figure 6:
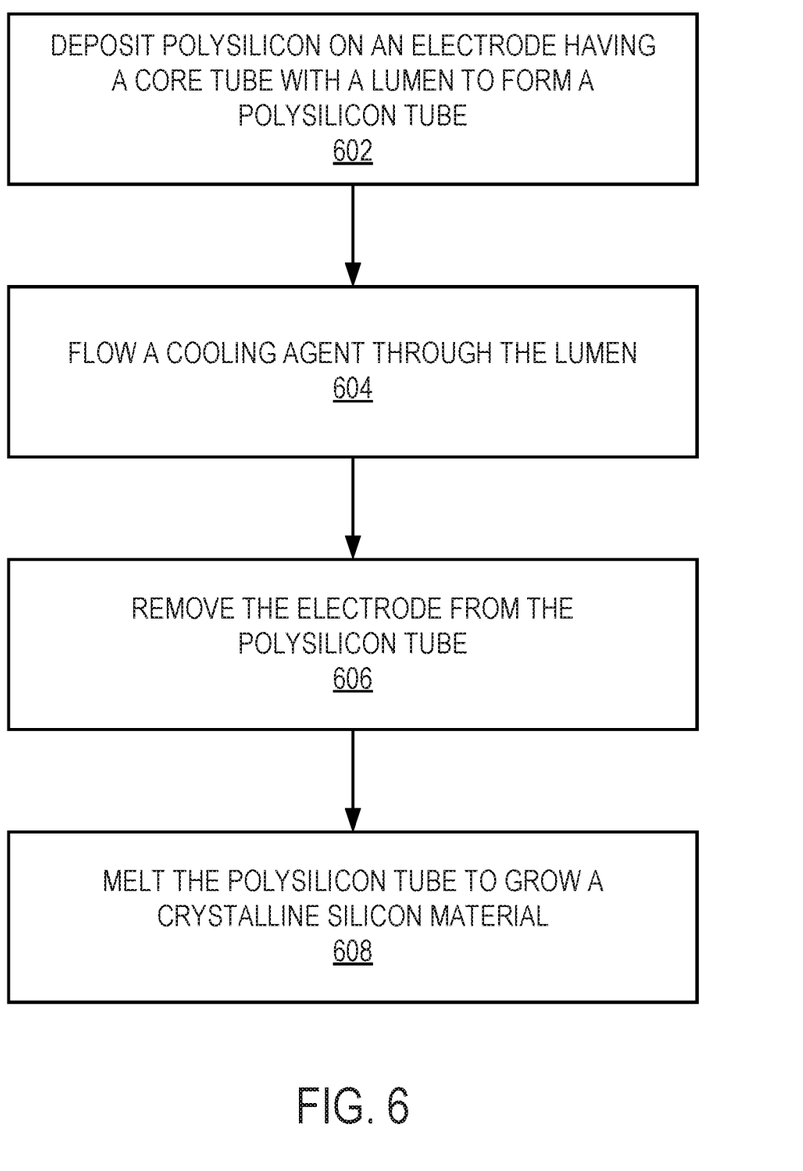
FIG. 6 is a flowchart of a method of fabricating a crystalline silicon material in accordance with an embodiment.

Referring to FIG. 6, a flowchart of a method of fabricating a crystalline silicon material, e.g., a single-crystalline silicon material, in accordance with an embodiment. At operation 602, polysilicon is deposited on the electrode 100 to form a polysilicon tube around the electrode 100. More particularly, deposition of the polysilicon may be performed in a CVD process using a CVD system that incorporates the electrode 100. That is, the electrode 100 described above may be incorporated in any of numerous CVD processes that are known for depositing polycrystalline silicon, i.e., polysilicon, onto pure silicon seed pins. Such processes include deposition of polysilicon from trichlorosilane or silane using reactions in low-pressure CVD systems. As such, the reactions may be performed at elevated temperatures. As described above, however, the temperatures required for polysilicon deposition onto the electrode 100 may be lower than those required in a conventional "Siemens" system having pure silicon seed pins. Thus, throughput of the CVD process using a CVD system with the electrode 100 may be increased as compared to a conventional "Siemens" CVD process.

Figure 7A:
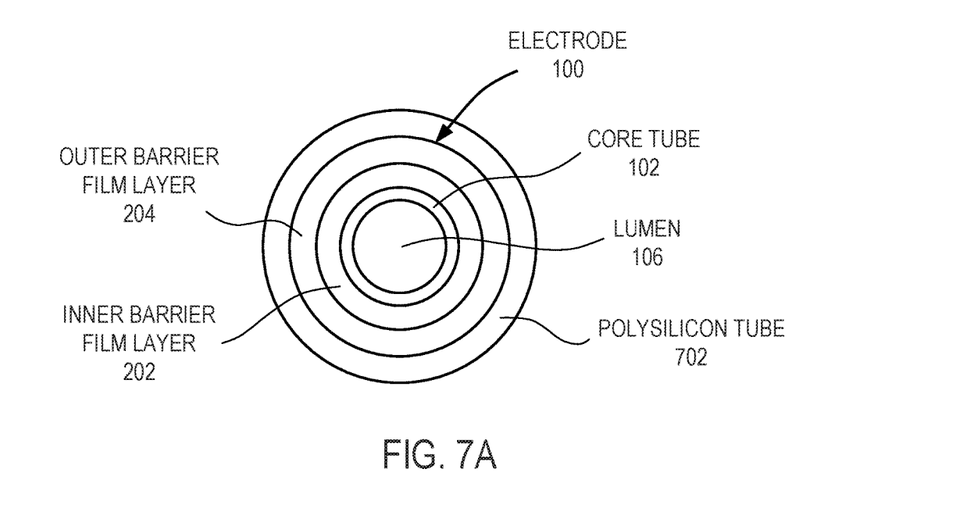
FIGS. 7A-7D are cross-sectional views of a tubular polysilicon feed rod being formed using a deposition electrode in accordance with an embodiment.

Referring to FIG. 7A, a cross-sectional view of a tubular polysilicon feed rod being formed on the electrode 100 of a CVD system is shown at an early stage of a CVD process. A polysilicon tube 702 may be deposited on the outer barrier film layer 204 of the barrier film 112 at elevated temperatures. At the elevated temperatures, the core tube 102 material may have a tendency to diffuse into polysilicon in the absence of a barrier. Thus, the barrier film 112 may prevent such diffusion to provide an extremely pure overall quality of the polysilicon tube 702 as it is formed around the electrode 100.

Figure 7B:
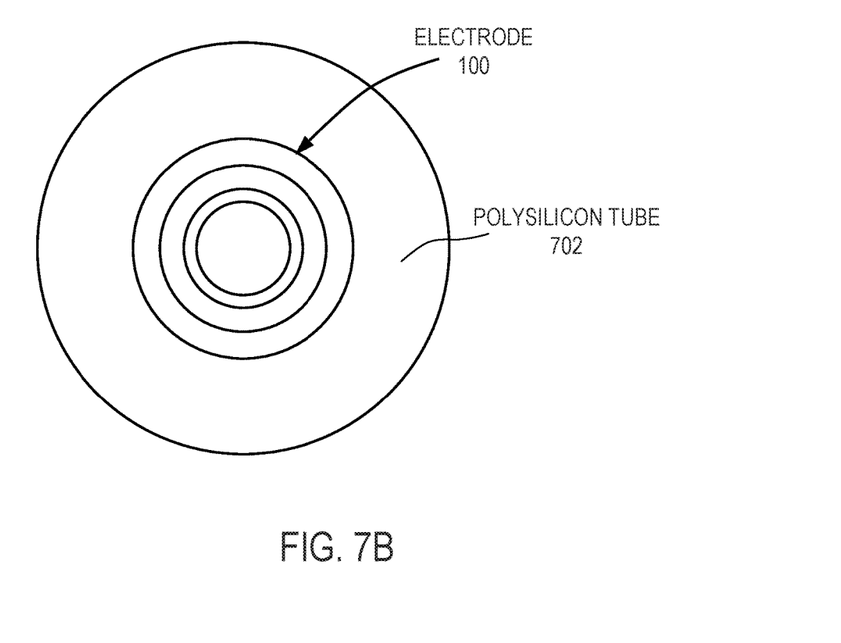

Referring to FIG. 7B, a cross-sectional view of the tubular polysilicon feed rod being formed on the electrode 100 of the CVD system is shown after the polysilicon tube 702 has reached a desired ingot diameter. More particularly, the polysilicon tube 702 may have an outer diameter that is suitable to use the polysilicon tube 702 as a direct feed rod in a float zone process. In an embodiment, an outer diameter of the polysilicon tube 702 may be in a range of 15-20 cm. As described above, the electrode 100 may decrease the time required to progress from the early stage of the CVD process illustrated in FIG. 7A to the stage shown in FIG. 7B. For example, the time may be reduced from about 150 hours using a conventional "Siemens" CVD process and system to a shorter timeframe using a CVD process and system that incorporates the electrode 100. The reduction in time may depend upon the outer diameter of the electrode 100, but in an embodiment, may be reduced by half of the time or more using the conventional "Siemens" CVD process and system.

It shall be appreciated that a ratio between an inner diameter of polysilicon tube 702 and an outer diameter of polysilicon tube 702 after deposition may provide a balance between being large enough to make surface area deposition occur quickly and small enough that the polysilicon tube 702 may be transformed into a solid rod using a secondary process, e.g., a float zone process, as described below. More particularly, the polysilicon tube 702 may have an outer diameter and an inner diameter such that, after melting the tube into a rod form and thus eliminating the inner diameter, the final outer diameter is a predetermined diameter useful for manufacturing photovoltaic cells. For example, the inner diameter of polysilicon tube 702 after deposition may be in a range of 5-50 mm, and the predetermined final outer diameter may be 200 mm.

Referring again to FIG. 6, at operation 604, after growing the polysilicon tube 702 through the CVD process, a cooling agent may be flowed through the lumen 106 of the core tube 102 within the conductive wall 104. The cooling agent may include a fluid, such as a liquid or a gas, having a temperature and/or a heat capacity to provide cooling of the core tube 102. For example, the cooling agent may include a cold liquid, i.e., a liquid having a temperature below room temperature, such as liquid nitrogen or chilled water. The cooling agent may include a cold gas, such as an inert gas cooled below room temperature. In an embodiment, the cooling agent includes a liquid or a gas near room temperature, e.g., in a range of 16-27° C. The liquid or gas may have a specific heat capacity greater than 1.5, e.g., greater than 2.0 or 4.0. Thus, the temperature and/or heat capacity of the cooling agent may effect rapid cooling of the core tube 102 and the polysilicon tube 702 around the core tube 102.

Figure 7C:
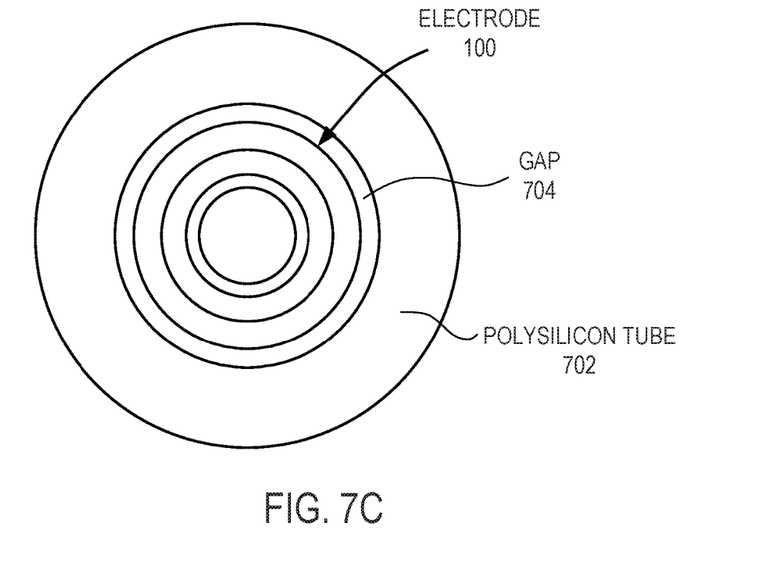

Referring to FIG. 7C, a cross-sectional view of an electrode 100 of a CVD system being removed from a tubular polysilicon feed rod is shown in accordance with an embodiment. Rapid cooling of the core tube 102 may cause the core tube 102, and the barrier film 112 around the core tube 102, to reduce in diameter. Since the core tube 102 and barrier film 112 may include similar coefficients of thermal expansion, passing the cooling agent may result in the components of the electrode 100 shrinking at a similar rate. Accordingly, the outer surface of the barrier film 112 may reduce in diameter along with the core tube 102. Furthermore, the coefficient of thermal expansion of the polysilicon material used to form the polysilicon tube 702 may be different, e.g., lower than, the coefficient of thermal expansion of the electrode 100 components. Thus, as the electrode 100 is cooled, a gap 704 may be formed between the electrode 100 and the polysilicon tube 702. That is, the polysilicon tube 702 may separate from the electrode 100.

Referring again to FIG. 6, at operation 606, the electrode 100 may be removed from the polysilicon tube 702. After the polysilicon tube 702 is separated from the electrode 100, the electrode 100 may be extracted from an inner lumen of the polysilicon tube 702. In an embodiment, the electrode 100 is reusable to perform several additional deposition processes and to form additional polysilicon tubes 702. The barrier film 112 may be deposited on the core tube 102 prior to initiating the process described with respect to FIG. 6, and thus, the electrodes 100 may be supplied as consumable parts to be used in existing deposition equipment. Accordingly, after performing operation 606, the electrode 100 may be reinserted in the same deposition equipment or used in a different deposition equipment. More particularly, in a case where the barrier film 112 remains intact, the electrodes 100 may be used for additional deposition processes and to form additional polysilicon tubes 702. When the barrier film 112 is damaged during the deposition process, the barrier film 112 may be stripped and/or recoated for reuse. Thus, electrodes 100 may be reusable and need not be discarded after the deposition process as may be the case using existing seed rod technologies.

Figure 7D:
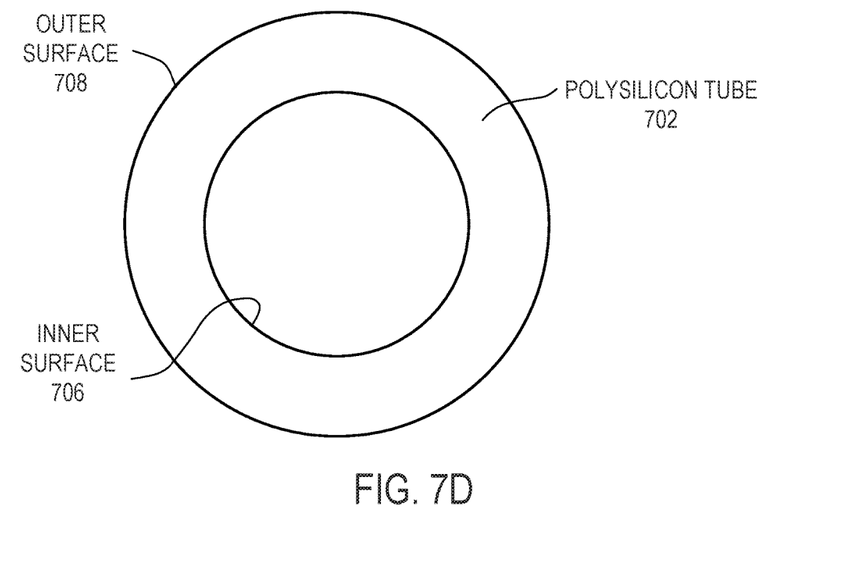

Referring to FIG. 7D, a cross-sectional view of a tubular polysilicon feed rod is shown in accordance with an embodiment. After removing the electrode 100, the polysilicon tube 702 can be used as a direct feed rod in a float zone process. The polysilicon tube 702, unlike conventional polysilicon feed rods, includes a tubular structure having an inner surface 706 and an outer surface 708. This unique structure may allow for various alterations to be made in the float zone process as compared to conventional float zone processes. For example, an RF element, such as an RF coil, used in the float zone process may be modified to adjust to the tubular structure. Furthermore, the tubular structure may be held on the outer surface 708 and/or the inner surface 706 during the float zone process. For example, the polysilicon tube 702 may be gripped by a chuck or pin that is inserted into the lumen 106 of the polysilicon tube 702.

Figure 8:
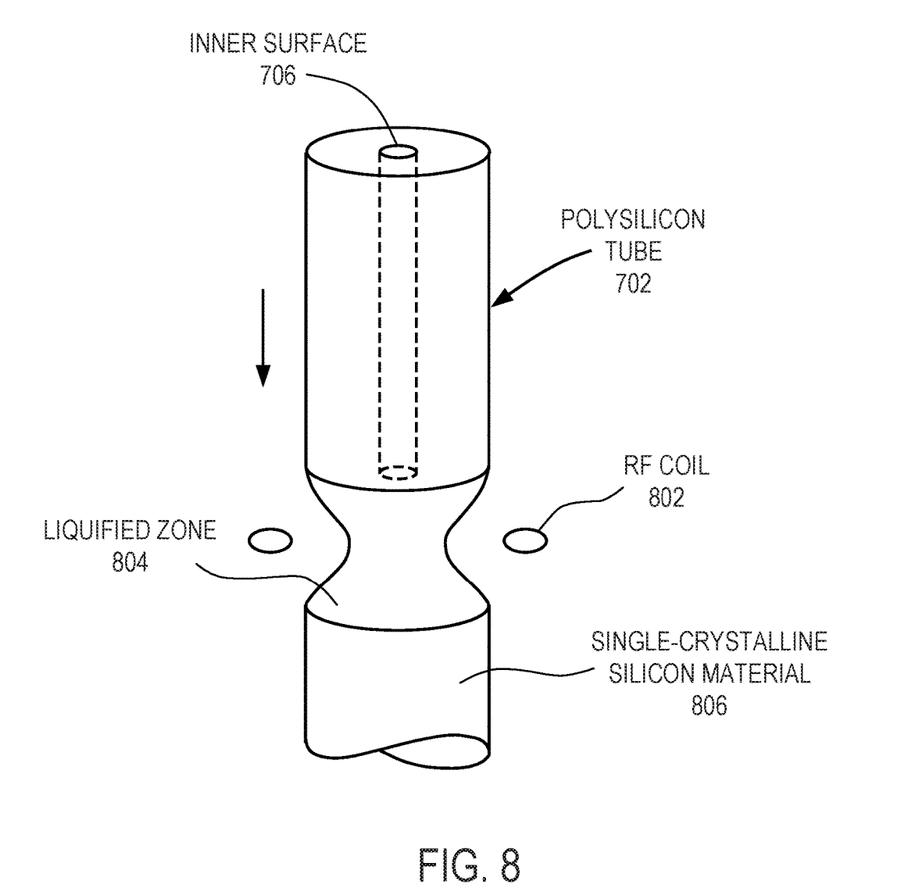
FIG. 8 is a partial perspective view of a single-crystalline silicon material being formed from a tubular polysilicon feed rod using a float zone process in accordance with an embodiment.

Referring again to FIG. 6, at operation 608, the polysilicon tube 702 may be melted to grow a crystalline silicon material. For example, the polysilicon tube 702 may be melted in a float zone process to grow a single-crystalline silicon material. Referring to FIG. 8, a partial perspective view of a single-crystalline silicon material 806 being formed from a tubular polysilicon feed rod using a float zone process is shown in accordance with an embodiment. The polysilicon tube 702, which includes a lumen defined by the inner surface 706 and may thus be referred to as a tubular polysilicon feed rod (as opposed to a solid-core polysilicon feed rod), may be fed directly through an RF coil 802 of the float zone reactor (or alternatively, the RF coil 802 may be passed axially over the polysilicon tube 702) to generate a melted region, i.e., a liquefied zone 804, in the polysilicon tube 702. Impurities in the liquefied zone 804 tend to remain in the liquefied zone 804 and therefore migrate from one end of the polysilicon tube 702 to another end of the polysilicon tube 702 as the tube is fed through the RF coil 802. More particularly, in a case where the polysilicon tube 702 is fed downward through the RF coil 802, as shown in FIG. 8, the liquefied zone 804 will propagate upward and urge the impurities toward the upper end of the polysilicon tube 702.

Figure 9:
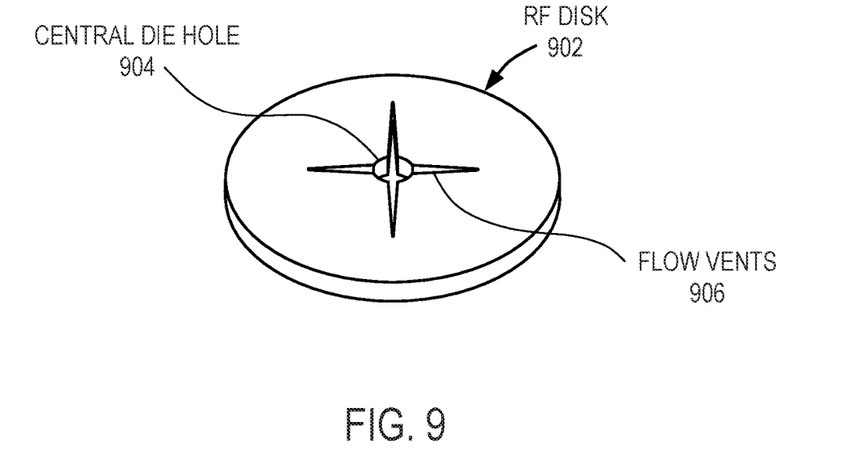
FIG. 9 is a perspective view of an RF disc for use in a float zone process in accordance with an embodiment.

Referring to FIG. 9, a perspective view of an RF disc for use in a float zone process is shown in accordance with an embodiment. The RF element may be an RF disc 902 used in a float zone process to melt a polysilicon tube 702, and thus, may include features specific to such a process. For example, the RF disc 902 may replace an RF coil 802 and may include a disc plate having a passage formed in the plate to allow the liquefied zone 804 to transfer from one side of the disc to the other. More particularly, the passage may include a central die hole 904 having a diameter less than an outer diameter of the outer surface 708 of the polysilicon tube 702. The RF disc 902 may also include several flow vents 906 extending laterally from the central die hole 904. The flow vents 906 may extend laterally along radial lines that are equally spaced, e.g., in the case of four flow vents 906 there may be a ninety-degree spacing between each flow vent 906. The RF disc 902 may be formed from a material that conducts RF energy to facilitate heating and melting of the polysilicon tube 702 and to form the liquefied zone 804. Accordingly, the polysilicon tube 702 may pass through the flow vents 906 and the central die hole 904 of the RF disc 902 to grow the single-crystalline silicon material 806.

The high quality single-crystalline silicon material 806 produced by the float zone process using the tubular polysilicon feed rod may be subsequently processed for photovoltaic, semiconductor, and/or other applications that require single crystal silicon for optimal performance and efficiency. For example, the single-crystalline silicon material 806 may be sliced to produce circular or polygonal solar cells that are combined into solar panels.

Thus, a high throughput CVD process and system to fabricate low cost tubular polysilicon rods, which can be used as direct feedstock materials in a float zone process have been disclosed.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. For example, in an embodiment, the polysilicon tube 702 formed using the CVD process and system having the electrode 100 may subsequently be used as a feed stock material in a conventional Czochralski ingot growth method for producing a single-crystalline silicon material. In another embodiment, the polysilicon tube 702 formed using the CVD process and system having the electrode 100 may subsequently be used in a cast ingot growth method for fabricating multi-crystalline silicon technology. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An electrode for chemical vapor deposition of polysilicon, comprising:
   a core tube having a conductive wall around a lumen, wherein the lumen extends between a first end and a second end of the core tube to carry a liquid cooling agent through the electrode; and
   a barrier film around the conductive wall, wherein the barrier film includes a metal diffusion barrier material, and wherein the barrier film has an undulating outer surface while the lumen is linear and is circular from a cross-sectional view.

2. The electrode of claim 1, wherein the barrier film includes an inner barrier film layer covering the conductive wall, and an outer barrier film layer covering the inner barrier film layer.

3. The electrode of claim 2, wherein the inner barrier film layer includes the metal diffusion barrier material, and wherein the outer barrier film layer includes a second metal diffusion barrier material.

4. The electrode of claim 3, wherein the metal diffusion barrier material includes a first coefficient of thermal expansion, wherein the second metal diffusion barrier material includes a second coefficient of thermal expansion, and wherein the first coefficient of thermal expansion is different than the second coefficient of thermal expansion by less than 20%.

5. The electrode of claim 3 further comprising an intermediate barrier film layer between the inner barrier film layer and the outer barrier film layer, wherein the metal diffusion barrier material includes a first coefficient of thermal expansion, wherein the second metal diffusion barrier material includes a second coefficient of thermal expansion, and wherein the first coefficient of thermal expansion is different than the second coefficient of thermal expansion by more than 20%.

6. An electrode for chemical vapor deposition of polysilicon, comprising:
   a core tube having a conductive wall around a lumen, wherein the lumen extends between a first end and a second end of the core tube to carry a liquid cooling agent through the electrode; and
   a barrier film around the conductive wall, wherein the barrier film includes an undulating outer surface while the lumen is linear and is circular from a cross-sectional view.

7. The electrode of claim 6, wherein the core tube includes a fin extending radially outward from a central axis of the lumen, and wherein the fin includes a peak between a plurality of valleys, the peak having a respective radial separation from the central axis greater than respective radial separations of the valleys from the central axis.

8. The electrode of claim 7, wherein the undulating outer surface extends over the fin in a peripheral direction around the central axis and includes a curvilinear cross-sectional outer edge.

9. The electrode of claim 7, wherein the undulating outer surface extends over the fin in a peripheral direction around the central axis and includes a rectilinear cross-sectional outer edge.

10. The electrode of claim 7, wherein the radial separation between the peak and the central axis varies between the first end and the second end of the core tube such that the electrode includes an axial undulation.

11. The electrode of claim 7, wherein the fin extends helically around the central axis between the first end and the second end of the core tube such that the electrode includes a thread.

* * * * *